United States Patent
Grens et al.

(10) Patent No.: US 10,079,607 B1
(45) Date of Patent: Sep. 18, 2018

(54) CALIBRATED LOOKUP TABLE FOR PHASE-LOCKED LOOP RECONFIGURATION

(71) Applicant: BAE SYSTEMS Information and Electronic Systems Integration Inc., Nashua, NH (US)

(72) Inventors: Curtis M. Grens, Nashua, NH (US); Justin A. Cartwright, Merrimack, NH (US); Gregory M. Flewelling, Freeport, ME (US); Richard L. Harwood, Westford, MA (US); James M. Meredith, Westford, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 15/689,736

(22) Filed: Aug. 29, 2017

(51) Int. Cl.
*H03L 7/06* (2006.01)
*H03L 7/093* (2006.01)
*H03L 7/10* (2006.01)

(52) U.S. Cl.
CPC .............. *H03L 7/093* (2013.01); *H03L 7/103* (2013.01); *H03L 2207/50* (2013.01)

(58) Field of Classification Search
CPC ....................................................... H03L 7/093
See application file for complete search history.

(56) References Cited

U.S. PATENT DOCUMENTS 9,191,056 B2 * 11/2015 Shima ...................... G06F 1/08

* cited by examiner

*Primary Examiner* — Daniel Puentes
(74) *Attorney, Agent, or Firm* — Finch & Maloney PLLC

(57) ABSTRACT

Techniques are provided for phase-locked loop (PLL) configuration, based on a calibrated lookup table (LUT). A methodology implementing the techniques according to an embodiment includes selecting one of a number of voltage controlled oscillators (VCOs) of the PLL, and selecting a tuning parameter to control the VCO. The method further includes testing the PLL, using multiple loop divider values, to determine a minimum and maximum value that define the lower and upper bounds of a range of loop divider values for which the PLL achieves a locked state while using the selected VCO and tuning parameter. The method further includes storing PLL configuration parameters to an entry in the configuration LUT, the PLL configuration parameters to include an identification of the selected VCO, the selected tuning parameter, the minimum loop divider value, and the maximum loop divider value. The method iterates using additional combinations of selected VCOs and tuning parameters.

26 Claims, 8 Drawing Sheets

PLL
Configuration
LUT
124

| VCO Select 206 | VCO Tune Word 208 | Div Value Min 402 | Div Value Max 404 | VCO Bias 210 | Loop Filter Gain 204 | Output Freq Range 406 |
|---|---|---|---|---|---|---|
| 0 | 0 | val | val | val | val | val-val |
| ⋮ | ⋮ | val | val | val | val | val-val |
| 0 | M-1 | val | val | val | val | val-val |
| 1 | 0 | val | val | val | val | val-val |
| ⋮ | ⋮ | val | val | val | val | val-val |
| 1 | M-1 | val | val | val | val | val-val |
| ⋮ | ⋮ | val | val | val | val | val-val |
| ⋮ | ⋮ | val | val | val | val | val-val |
| N-1 | M-1 | val | val | val | val | val-val |

Table Entries 402

FIG. 4

CALIBRATED LOOKUP TABLE FOR PHASE-LOCKED LOOP RECONFIGURATION

STATEMENT OF GOVERNMENT INTEREST

This invention was made with United States Government assistance under Contract No. HR0011-12-C-0083 awarded by DARPA. The United States Government has certain rights in this invention.

FIELD OF DISCLOSURE

The present disclosure relates to phase-locked loop circuits, and more particularly, to techniques for calibrated configuration/reconfiguration of such circuits.

BACKGROUND

Phase-locked loop (PLL) circuits accept an input reference signal and generate an output signal that is related in phase and/or frequency to the reference signal. The relationship between the output signal and the reference signal is controlled by a number of configuration parameters that generally include a feedback loop divider value, a choice of voltage controlled oscillators (VCOs), and a tuning value for the selected VCO which specifies a coarse frequency sub-band within the VCOs frequency range. The loop divider is a value that determines a ratio between the output signal frequency and the reference signal frequency for a given combination of reference signal, VCO, and tuning value. The PLL can generally be reconfigured as needed to provide an output signal with desired characteristics by adjusting one or more of these configuration parameters.

Variations in voltage, temperature, and other conditions, can cause the PLL to change behavior over time. For example, the band-edges and/or bias settings of the VCOs can shift, resulting in performance degradation of the PLL. This degradation can include increased acquisition time (i.e., the time for the PLL to lock on to the phase of the reference) and reduced frequency accuracy. Periodic calibration of the PLL can help to overcome these problems.

Existing calibration methods typically attempt to match each possible loop divider value with other appropriate PLL settings necessary to generate each desired output frequency at an acceptable level of fidelity. This approach generally requires a table of configuration parameters that includes an entry for each output frequency step size (e.g., loop divider value). The size of this table can vary greatly, however, for highly-configurable PLLs that employ multiple VCOs, many tuning values, and support a wide range of reference signal frequencies. A general purpose PLL hardware implementation must support the worst-case scenario with the largest possible table size. This approach is inefficient, both in memory consumption and table search processing, for PLL applications that operate over smaller frequency ranges that are associated with smaller subsets of the largest table size.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts.

FIG. 4 illustrates an example calibrated PLL configuration lookup table, configured in accordance with certain of the embodiments disclosed herein.

Figure 1:
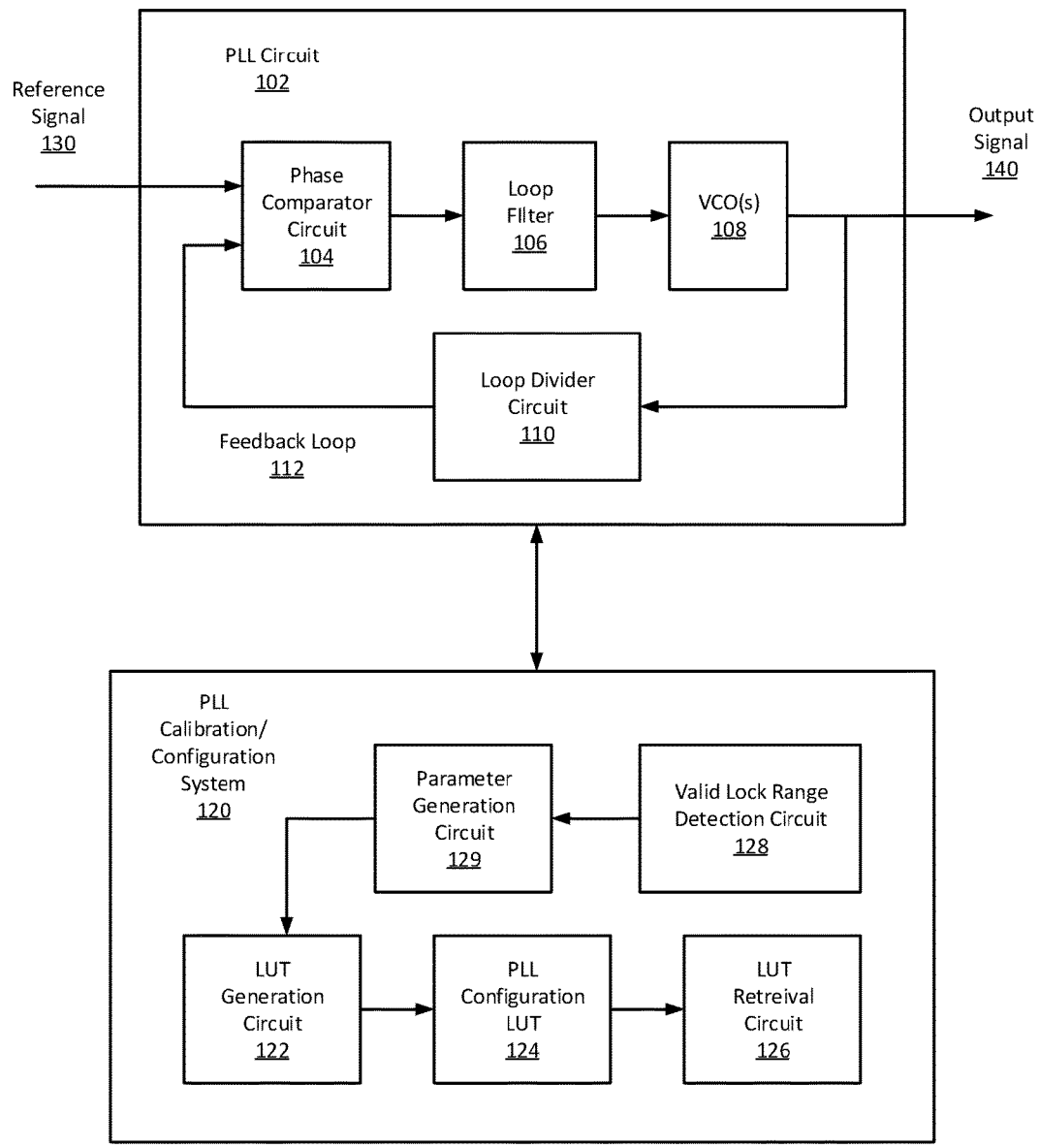
FIG. 1 is a top-level block diagram of a phase-locked loop (PLL) circuit and associated calibration/configuration system, configured in accordance with certain embodiments of the present disclosure.

Although the following Detailed Description will proceed with reference being made to illustrative embodiments, many alternatives, modifications, and variations thereof will be apparent to those skilled in the art.

DETAILED DESCRIPTION

Generally, this disclosure provides techniques for configuration and reconfiguration of phase-locked loop (PLL) circuits, using calibrated parameters that are stored in an efficient lookup table (LUT) implementation. The LUT is generated and updated periodically, for example in response to changing environmental conditions such as temperature or voltage, which can cause the behavior of the PLL to vary over time. The size of the LUT is managed by limiting the number of entries in the LUT to those combinations of parameters that allow the PLL to achieve a locked state. Techniques are also provided to select a relatively optimal entry from the LUT to implement a request for reconfiguration of the PLL, as will be described in greater detail below.

The disclosed techniques can be implemented, for example, in a computing system or a software product executable or otherwise controllable by such systems, although other embodiments will be apparent. The system or product is configured to generate and utilize a calibrated PLL configuration lookup table. In accordance with an embodiment, a methodology to implement these techniques includes selecting one of a number of VCOs associated with the PLL, and selecting a tuning parameter, from a range of possible frequency tuning parameters, to control the selected VCO. The method further includes testing multiple feedback loop divider values for the PLL, to determine a minimum and a maximum loop divider value that define the lower and upper bounds of a range of loop divider values for which the PLL achieves a locked state while using the selected VCO and tuning parameter, as will be described in greater detail below. The method further includes creating an entry in the LUT to store calibrated PLL configuration parameters which include an identification of the selected VCO, the selected tuning parameter, and the associated minimum and maximum loop divider values which have been calibrated to the PLL based on the locked state determination. In some embodiments, the configuration parameters may further include a pre-determined VCO bias and one or more pre-determined PLL loop filter gains that are associated with the selected VCO and tuning parameter. The method further includes iterating the above process using other combinations of selected VCOs and selected tuning parameters to generate additional entries in the LUT for all such desired combinations.

As will be appreciated in light of this disclosure, the techniques described herein may allow for improved PLL reconfiguration compared to existing methods that require greater memory and processing resources to work with larger tables that store all combinations of configuration parameters, including combinations that would fail to achieve PLL lock. The disclosed techniques can be implemented on a broad range of platforms including laptops, tablets, smart phones, communication devices, radios, and embedded devices. These techniques may further be implemented in hardware or software or a combination thereof.

FIG. 1 is a top-level block diagram 100 of a phase-locked loop (PLL) circuit and associated calibration/configuration system 120, configured in accordance with certain embodiments of the present disclosure. The PLL circuit 102 is shown to include a phase comparator circuit 104, a loop filter 106, one or more voltage controlled oscillators (VCOs) 108, and a feedback loop divider circuit 110, the operations of which will be described in greater detail below. The PLL calibration/configuration system 120 is shown to include a valid lock range detection circuit 128, a parameter generation circuit 129, a lookup table generation circuit 122, a PLL configuration lookup table 124, and a lookup table retrieval circuit 126, which will also be described in greater detail below.

At a high level, the PLL circuit 102 is configured to generate an output signal 140 at a desired frequency or phase relative to a reference input signal 130. This output signal may be employed for various purposes, including but not limited to, a clock signal to drive other circuits at various required frequencies, a synchronization signal, or a modulation/demodulation signal for use by a radio transceiver. PLL configuration/calibration system 120 is configured to set up or reconfigure the PLL circuit 102 to adjust the characteristics of the output signal to desired settings. System 120 generates and uses a relatively efficient lookup table implementation of calibrated configuration parameters for this purpose, as will be described in greater detail below.

Figure 2:
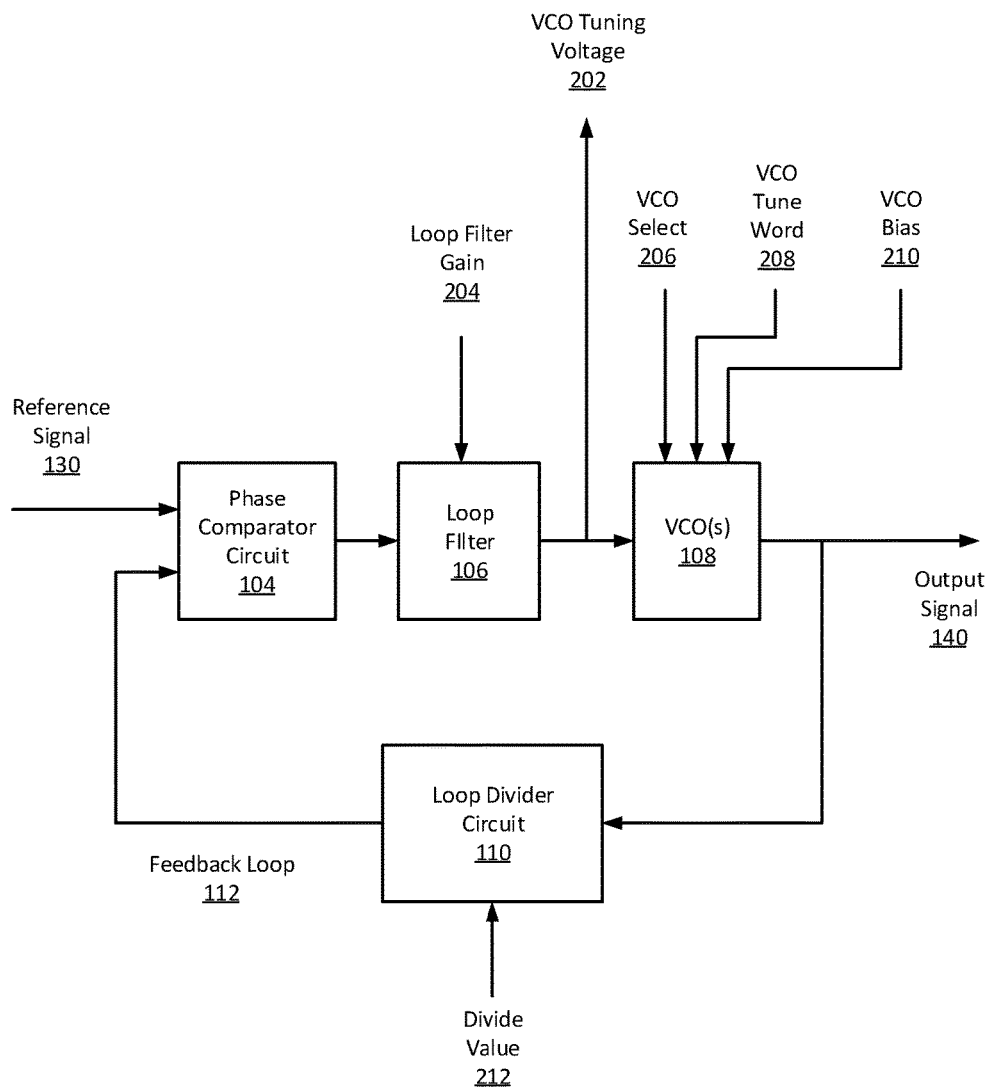
FIG. 2 is a more detailed block diagram of a PLL circuit, configured in accordance with certain of the embodiments disclosed herein.

FIG. 2 is a more detailed block diagram of the PLL circuit 102, configured in accordance with certain of the embodiments disclosed herein. The phase comparator circuit 104 is configured to compare the phase of the reference signal 130 to the phase of the output signal 140, which is provided through feedback loop 112, ignoring, for the moment, the effect of the loop divider circuit 110. The comparator 104 generates an error signal that is proportional to the difference between the two phases. So, for example, if the output signal 140 and the reference signal 130 are nearly aligned in phase and frequency, the error signal would be substantially zero. If the output signal drifts away from the reference signal, the error signal will increase.

The loop filter 106 is configured to filter the error signal, for example through the use of a low-pass filter to reduce the effect of short-term variations or temporary spikes that might otherwise create instability in the PLL circuit. In some embodiments, a loop filter gain 204 and/or other filter parameters may be provided to adjust the behavior of the PLL circuit, for example to maintain a constant gain as other parameters are changed. The output of the loop filter 106 is a VCO tuning voltage 202.

One or more voltage controlled oscillators (VCOs) 108 are included within the PLL circuit and are configured to generate output signals 140 within different frequency bands. In some embodiments, the frequency bands of the different VCOs may overlap to some extent. The appropriate VCO may be selected through a VCO select signal 206 based on the desired output signal frequency relative to the available VCO frequency bands. The selected VCO may be further controlled through a VCO tuning word 208 which specifies a coarse frequency sub-band within that VCO. In some embodiments, the VCO sub-bands may also overlap with each other to some extent. A VCO bias parameter 210 may also be provided to adjust the VCO current bias, which can be dependent on the VCO tuning, to reduce phase noise of the output signal.

The selected VCO is then driven, within the selected frequency sub-band, by the VCO tuning voltage 202 provided by the loop filter 106. Thus, the frequency of the output signal 140 is driven towards that of the reference signal 130, through the feedback loop 112, until a lock is achieved and the frequencies match.

The feedback loop divider circuit 110 is configured to divide the output signal frequency down by a configurable loop divider value 212. The loop divider 212 is an integer value that determines a ratio between the output signal frequency and the reference signal frequency. For example, if the divider value is three, then the PLL circuit will achieve lock when the output signal frequency reaches three times the reference signal frequency. The divider value is thus related to the step size between realizable PLL output frequencies for a given reference signal frequency (e.g., one times the reference frequency, two times the reference frequency, three times the reference frequency, . . . etc.). Although the loop divider 212 is described as an integer in the present disclosure, for example to reduce the size of the table, it will be understood that in some embodiments the loop divider can be a fractional value.

Figure 3:
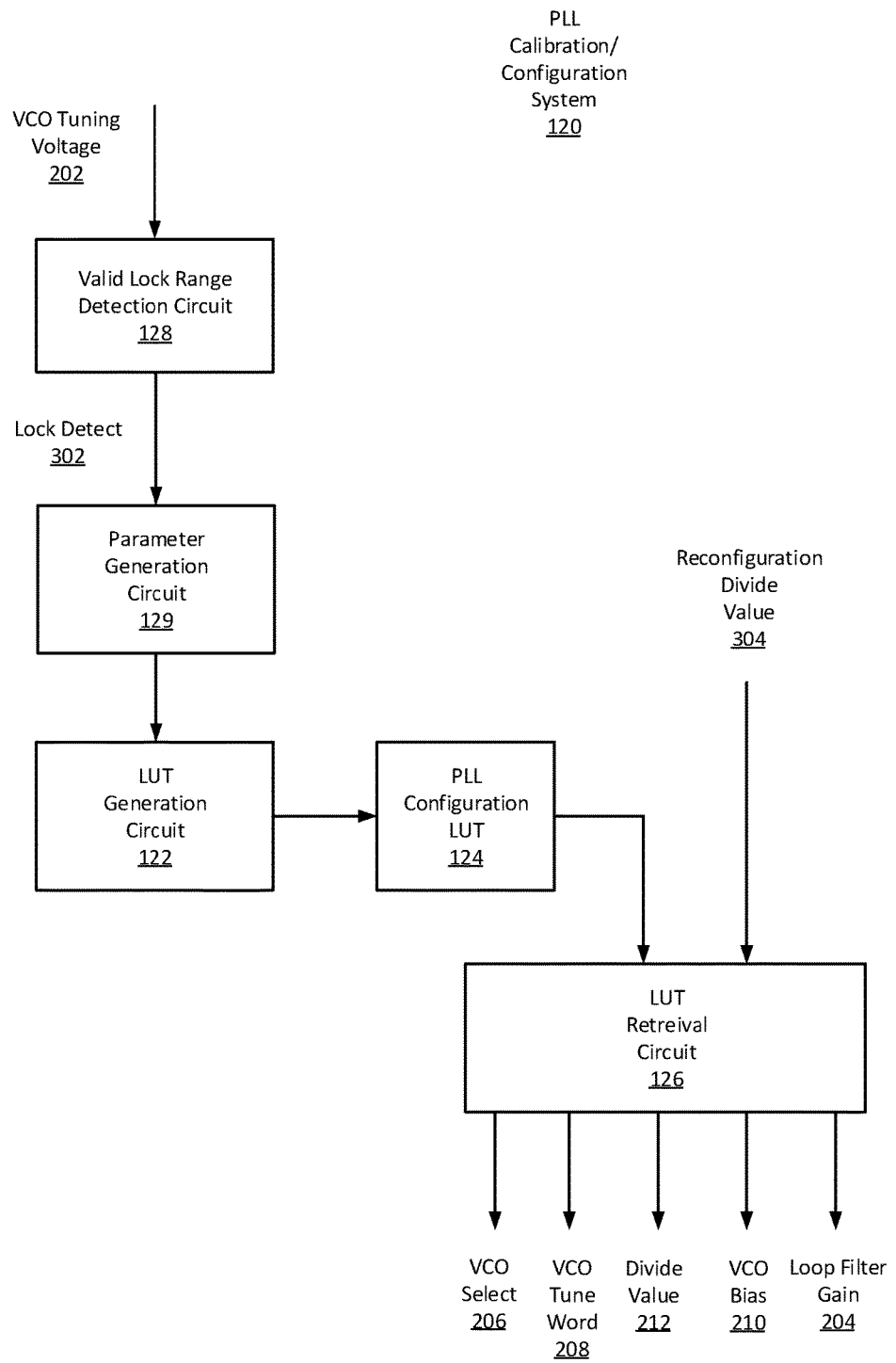
FIG. 3 is a more detailed block diagram of the PLL calibration/configuration system, configured in accordance with certain of the embodiments disclosed herein.

FIG. 3 is a more detailed block diagram of the PLL calibration/configuration system 120, configured in accordance with certain of the embodiments disclosed herein. The parameter generation circuit 129 is configured to generate calibrated PLL configuration parameters by determining a range of loop divider values, for a given VCO selection and VCO tuning word, for which the PLL is able to achieve a lock to the reference signal. The operation of the parameter generation circuit 129 will be described in greater detail below in connection with FIG. 5.

The valid lock range detection circuit 128 is configured to provide a lock detect signal 302 to the parameter generation circuit to indicate that the PLL has locked to the reference signal. In some embodiments, the valid lock range detection circuit 128 operates by comparing the VCO tuning voltage to a low voltage reference and a high voltage reference. While the VCO tuning voltage remains between the two reference voltages, the PLL is considered to be in a valid lock range.

The lookup table generation circuit 122 is configured to store the calibrated PLL configuration parameters to an entry in a configuration LUT associated with each selected VCO and tuning word. An example PLL configuration lookup table 124 is described below in connection with FIG. 4. In some embodiments, the lookup table generation circuit 122 may be further configured to allow for manual adjustment or override of individual entries in the table.

The lookup table retrieval circuit 126 is configured to select an optimal entry from the LUT 124 in a relatively efficient manner, and apply the calibrated parameters associated with that entry to the PLL in response to a request to reconfigure the PLL. The operation of the lookup table retrieval circuit 126 will be described in greater detail below in connection with FIG. 6.

FIG. 4 illustrates an example calibrated PLL configuration lookup table 124, configured in accordance with certain of the embodiments disclosed herein. The table 124 is shown to comprise a number of table entries 402 arranged in rows in this example. The first column of each row indicates the selected VCO 206, which may range from 0 to N−1 for a PLL that implements N VCOs. The second column of each row indicates the selected VCO tuning word 208, which in this example ranges from 0 to M−1 for each VCO that supports M tuning words, although in general there is no limitation that each VCO support the same number of tuning words. The third and fourth column of each row indicates the minimum loop divider value 402 and the maximum loop divider value 404, which have been calibrated for the PLL to achieve a locked state. In some embodiments, the maximum value may be expressed as an offset relative to the minimum value to reduce the number of bits required for storage. The fifth and sixth columns of each row indicate the VCO bias parameter 210 and the loop filter gain parameter 204, which may be predetermined for the selected VCO and tuning word.

In some embodiments, a seventh column may specify an output frequency range 406 associated with the range between the minimum loop divider and the maximum loop divider values for the selected VCO and tuning word. As previously mentioned, there may be overlap in the coarse frequency sub-bands of the VCOs, and thus there may also be overlap in the frequency ranges between multiple entries in the table. In other words, different sets of parameters, associated with different table entries, may be employed to generate an output signal with given characteristics, which can require a selection choice to be made, as described below.

As will be appreciated in light of this disclosure, the LUT 124 can be indexed by one or more of the parameters specified therein. In some embodiments, for instance, the LUT 124 is indexable via a code word associated with the reconfiguration divide value 304, such that application of a given code word to the LUT 124 identifies a corresponding minimum divide value 402, maximum divide value 404, VCO 206, tuning word 208, output frequency range 406 and/or other PLL configuration parameters. In other embodiments, the LUT 124 is indexable via the output frequency range 406 to identify a corresponding one or more other PLL configuration parameter. Still other embodiments may be indexed by any other PLL configuration parameter stored therein, or a combination of such parameters such as a hash function or a product generated from the combination of parameters, for more efficient access to table entries. It will be further appreciated that FIG. 4 illustrates one example LUT format and that other formats or layouts are possible in light of the present disclosure.

Figure 5:
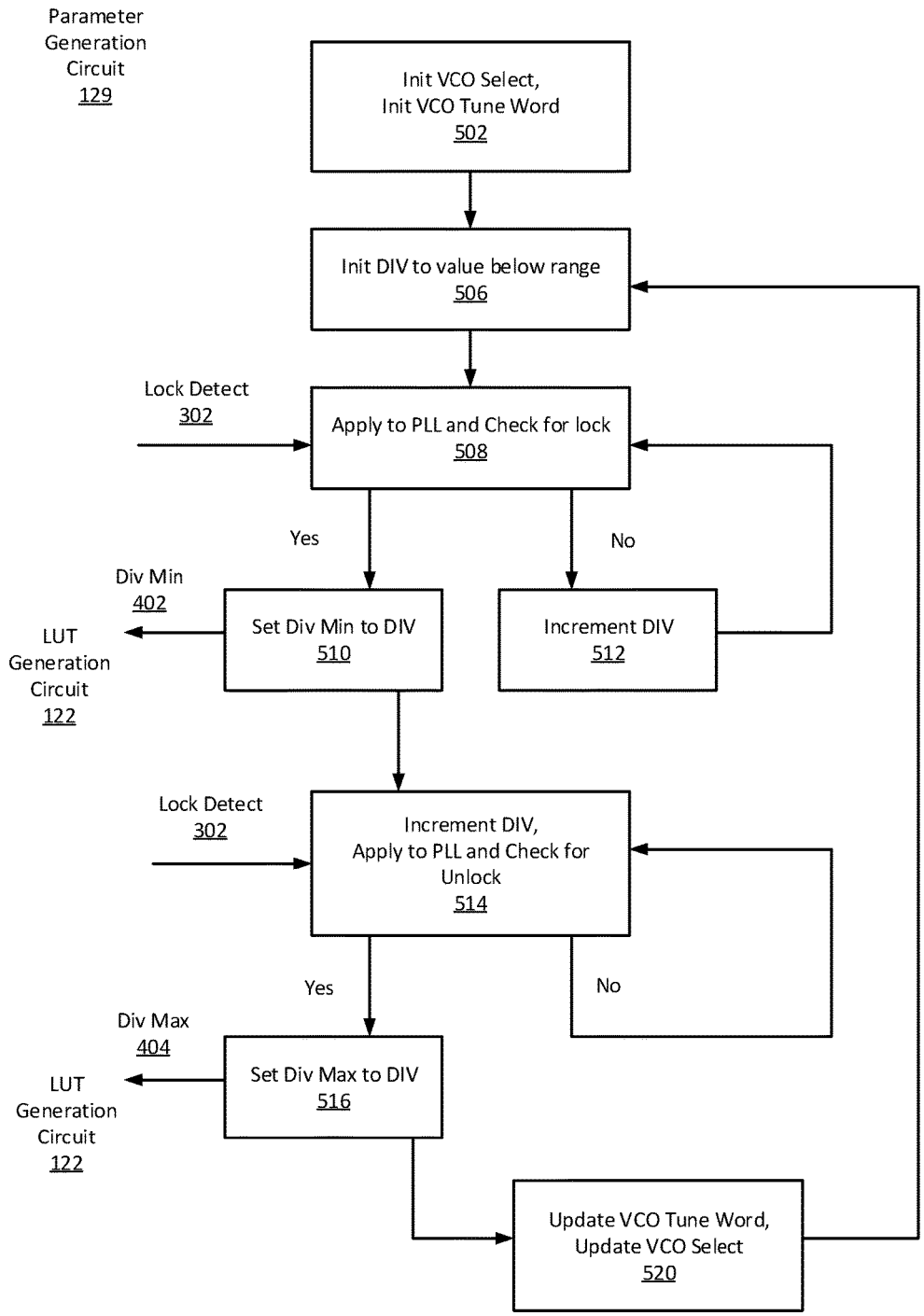
FIG. 5 is a flowchart illustrating a methodology for generation of parameters for the configuration lookup table, in accordance with certain of the embodiments disclosed herein.

FIG. 5 is a flowchart illustrating a methodology, as performed by the parameter generation circuit 129, for generation of parameters for the configuration lookup table 124, in accordance with certain of the embodiments disclosed herein. At operation 502, an initial VCO is selected along with an initial VCO tuning word for that VCO. At operation 506, a divide variable is initialized to a value below an expected viable range of loop divider values.

Next at operation 508, these parameters (the selected VCO, tuning word, and divide variable) are applied to the PLL, and the lock detect signal 302 is checked. If PLL lock is not achieved, then at operation 512, the divide variable is incremented and operation 508 is repeated, searching for a divide variable that achieves locked state. If PLL lock is achieved, then at operation 510, the divide variable is stored as the minimum loop divider value parameter 402, associated with the current selected VCO and tuning word. This minimum divider value parameter 402 is provided to the LUT generation circuit 122.

At operation 514, the divide variable is incremented again. The new parameters are applied to the PLL and the lock detect signal 302 is checked. If the PLL remains locked, then operation 514 is repeated, searching for a divide variable at which the PLL loses lock. When the PLL becomes unlocked, then at operation 516, the divide variable is stored as the maximum loop divider value parameter 404, associated with the current selected VCO and tuning word, which is provided to the LUT generation circuit 122.

At operation 520, a new VCO tuning word and or VCO are selected and the process repeats at operation 506, until all desired combinations of selected VCO and tuning words have been tested as entries for the lookup table 124.

Figure 6:
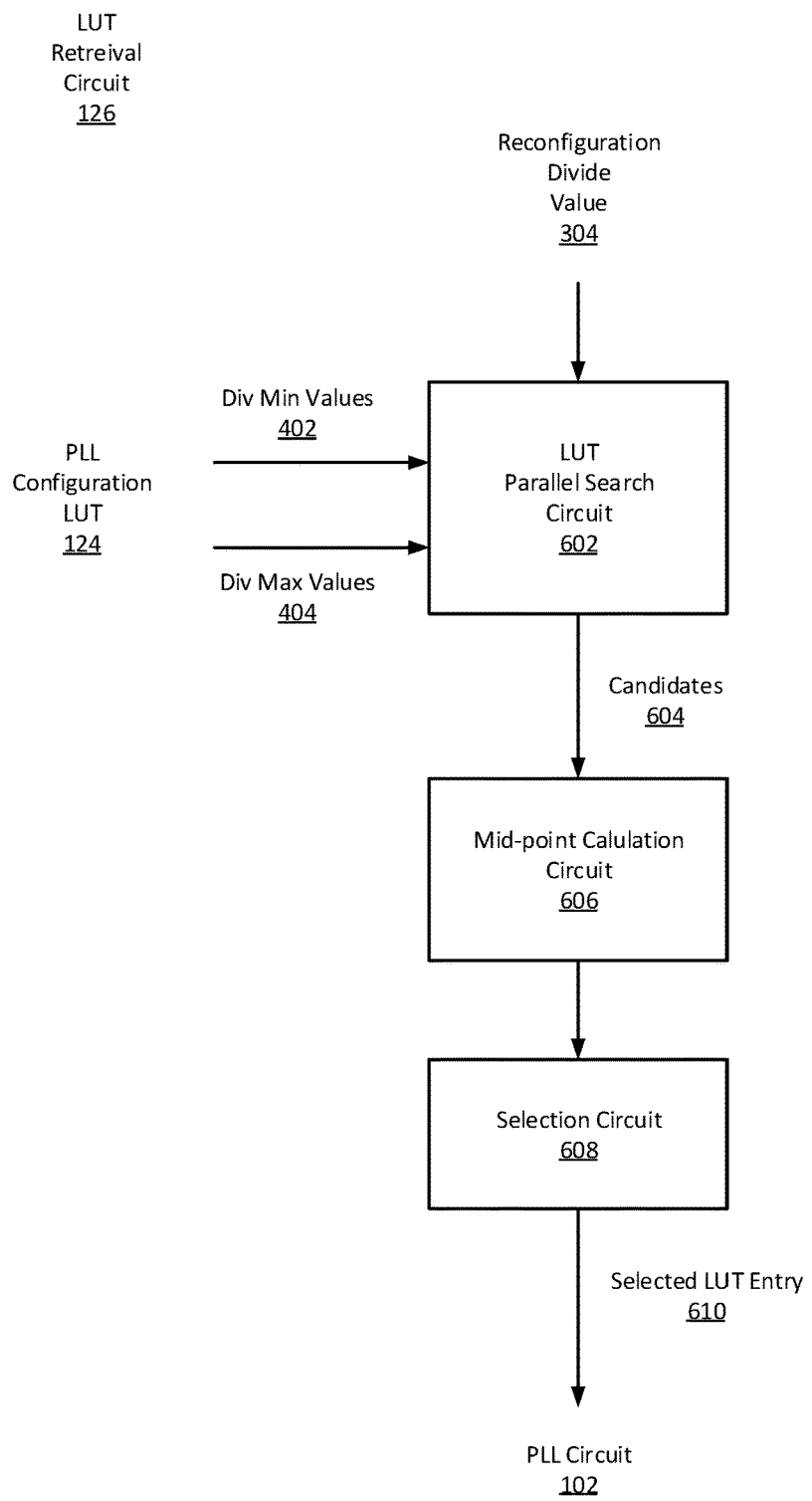
FIG. 6 is a more detailed block diagram of a lookup table retrieval circuit, configured in accordance with certain of the embodiments disclosed herein.

FIG. 6 is a more detailed block diagram of the lookup table retrieval circuit 126, configured in accordance with certain of the embodiments disclosed herein. LUT retrieval circuit 126 is shown to include an LUT parallel search circuit 602, a mid-point calculation circuit 606, and a selection circuit 608.

The LUT parallel search circuit 602 is configured to search the PLL configuration LUT 124 based on a requested reconfiguration divide value 304 associated with a desired reconfiguration of the PLL. The search is employed to find one or more candidate configuration LUT entries that specify a minimum loop divider value that is less than (or less than or equal to) the requested divide value and a maximum loop divider value that is greater than (or greater than or equal to) the requested divide value. Said differently, the purpose of the searches is to find a set of reconfiguration parameters in the LUT that will result in a desired output signal frequency.

In some embodiment, the LUT search circuit 602 is further configured to perform the search using parallel processing search operations. For example, each of the parallel searching operations can be applied to a different segment (i.e., group of rows) of the configuration LUT 124. If the LUT contained 64 entries or rows, then eight parallel search operations can search the table in approximately one-eighth of the time.

The mid-point calculation circuit 606 is configured to calculate a mid-point or average between the maximum loop divider value and the minimum loop divider value of each of the candidate configuration LUT entries resulting from the search. The Selection circuit 608 is configured to select an optimal one of the candidate configuration LUT entries for use in configuration or reconfiguration of the PLL. In some embodiments, the optimal selected candidate entry is the entry associated with the minimum distance between the calculated mid-point and the requested divide value. The selection circuit 608 is further configured to apply the parameters of the selected optimal candidate entry to the PLL to reconfigure the PLL.

Methodology

Figure 7:
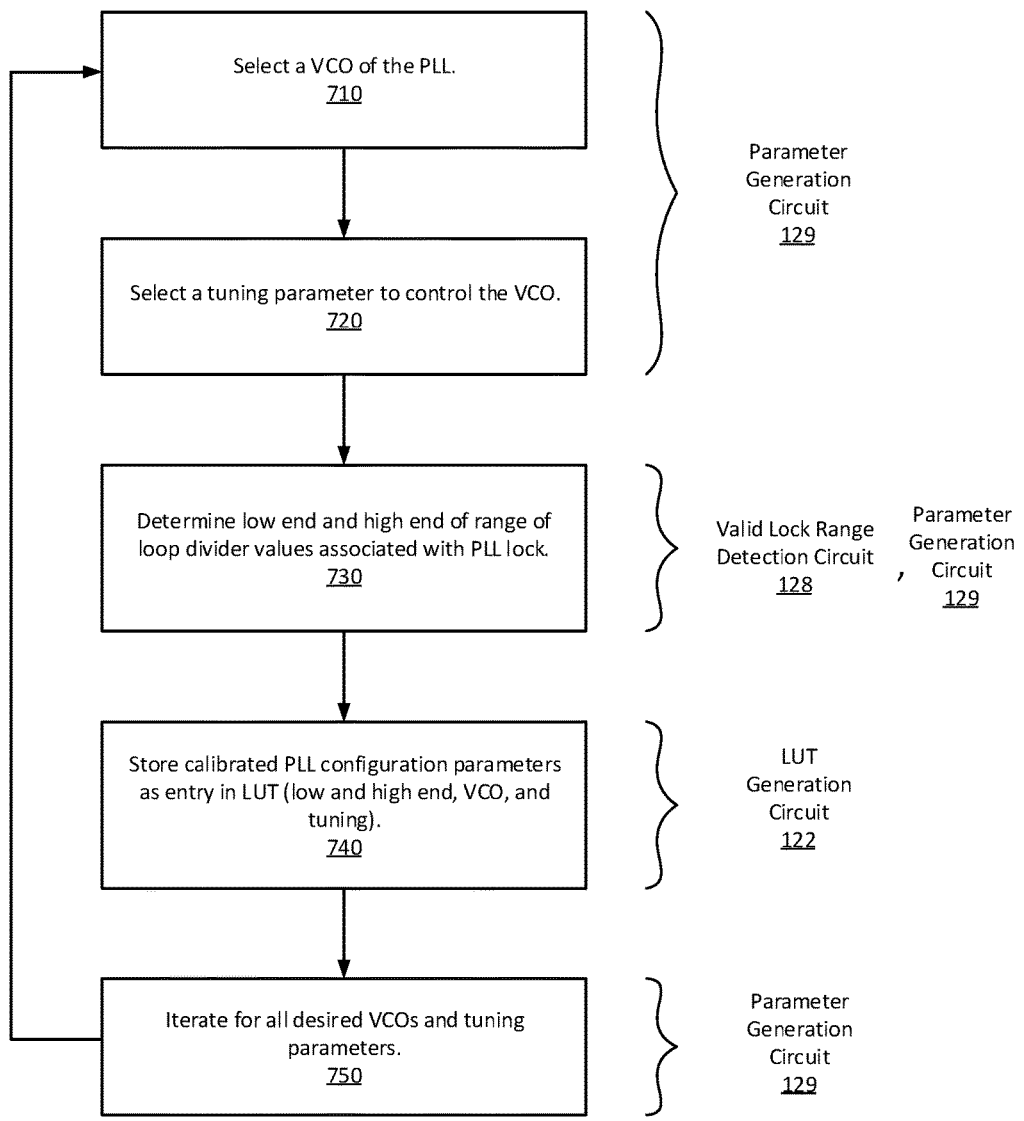
FIG. 7 is a flowchart illustrating a methodology for generation of a calibrated PLL configuration lookup table, in accordance with certain of the embodiments disclosed herein.

FIG. 7 is a flowchart illustrating an example method 700 for generation of a calibrated PLL configuration lookup table, in accordance with certain embodiments of the present disclosure. The PLL configuration LUT is implemented to store and provide calibrated configuration parameters for the PLL in a relatively efficient manner. As can be seen, the example method includes a number of phases and sub-processes, the sequence of which may vary from one embodiment to another. However, when considered in the aggregate, these phases and sub-processes form a process for LUT generation and use in accordance with certain of the embodiments disclosed herein. These embodiments can be implemented, for example using the system architecture illustrated in FIGS. 1-6 as described above. However other system architectures can be used in other embodiments, as will be apparent in light of this disclosure. To this end, the correlation of the various functions shown in FIG. 7 to the specific components illustrated in the other figures is not intended to imply any structural and/or use limitations. Rather, other embodiments may include, for example, varying degrees of integration wherein multiple functionalities are effectively performed by one system. For example, in an alternative embodiment a single module having decoupled sub-modules can be used to perform all of the functions of method 700. Thus, other embodiments may have fewer or more modules and/or sub-modules depending on the granularity of implementation. In still other embodiments, the methodology depicted can be implemented as a computer program product including one or more non-transitory machine readable mediums that when executed by one or more processors cause the methodology to be carried out. Numerous variations and alternative configurations will be apparent in light of this disclosure.

As illustrated in FIG. 7, in an embodiment, method 700 for generation of a PLL configuration lookup table commences by selecting, at operation 710, one of a number of voltage controlled oscillators (VCOs) associated with the PLL. Each of the VCOs are configured to generate frequencies within a specified range, and in some embodiments, the VCO frequency ranges may overlap to some extent. Next, at operation 720, a tuning parameter is selected from a range of possible frequency tuning parameters associated with frequency sub bands of the selected VCO.

At operation 730, the PLL is tested, using multiple loop divider values, to determine a minimum and a maximum loop divider value that define the lower and upper bounds of a range of loop divider values for which the PLL achieves a locked state while using the selected VCO and tuning parameter. Divider values within that range are thus calibrated to the PLL.

At operation 740, the calibrated PLL configuration parameters are stored as an entry in the configuration LUT. The PLL configuration parameters include an identification of the selected VCO, the selected tuning parameter, the minimum loop divider value, and the maximum loop divider value. In some embodiments, the configuration parameters may further include a pre-determined VCO bias and one or more pre-determined PLL loop filter gains that are associated with the selected VCO and tuning parameter.

At operation 750, the process is iterated with other combinations of selected VCOs and selected tuning parameters to generate additional entries in the LUT until all desired combinations have been processed.

Of course, in some embodiments, additional operations may be performed, as previously described in connection with the system. For example, the LUT may be searched, based on a requested divide value for PLL reconfiguration, to find one or more candidate LUT entries that specify a minimum loop divider value that is less than the requested divide value and a maximum loop divider value that is greater than the requested divide value. A mid-point may then be calculated, between the maximum loop divider value and the minimum loop divider value, for each of the candidate LUT entries, and a final selection made from among the candidates based on a closest distance between the mid-point and the requested divide value. The calibrated configuration parameters from the final selected entry may then be used to configure or reconfigure the PLL for use with the requested divide value.

Example System

Figure 8:
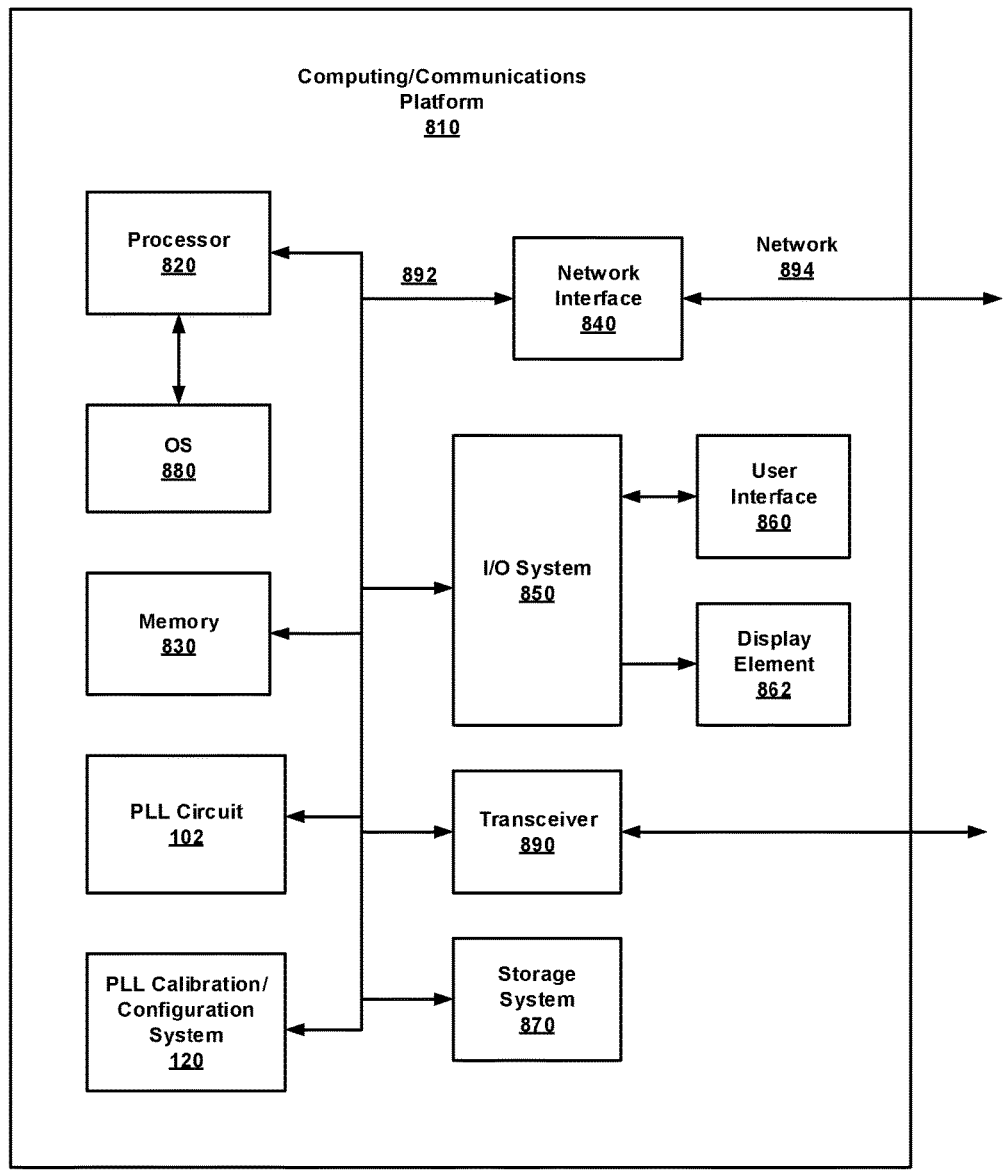
FIG. 8 is a block diagram schematically illustrating a platform configured to implement a PLL circuit and associated calibration/configuration system, in accordance with certain of the embodiments disclosed herein.

FIG. 8 illustrates an example system 800 configured to implement a PLL circuit and associated calibration/configuration system, in accordance with certain embodiments of the present disclosure. In some embodiments, system 800 comprises a computing or communications platform 810 which may host, or otherwise be incorporated into a personal computer, workstation, server system, laptop computer, ultra-laptop computer, tablet, touchpad, portable computer, handheld computer, palmtop computer, personal digital assistant (PDA), cellular telephone, combination cellular telephone and PDA, smart device (for example, smartphone or smart tablet), mobile internet device (MID), messaging device, data communication device, radio, and so forth. Any combination of different devices may be used in certain embodiments.

In some embodiments, platform 810 may comprise any combination of a processor 820, a memory 830, a PLL circuit 102, a PLL configuration/calibration system 120, a network interface 840, an input/output (I/O) system 850, a user interface 860, a display element 862, a transceiver 890, and a storage system 870. As can be further seen, a bus and/or interconnect 892 is also provided to allow for communication between the various components listed above and/or other components not shown. Platform 810 can be coupled to a network 894 through network interface 840 to allow for communications with other computing devices, platforms, or resources. In some embodiments, network 894 may include the Internet. Other componentry and functionality not reflected in the block diagram of FIG. 8 will be apparent in light of this disclosure, and it will be appreciated that other embodiments are not limited to any particular hardware configuration.

Processor 820 can be any suitable processor, and may include one or more coprocessors or controllers, such as an audio processor, a graphics processing unit, or hardware accelerator, to assist in control and processing operations associated with system 800. In some embodiments, the processor 820 may be implemented as any number of processor cores. The processor (or processor cores) may be any type of processor, such as, for example, a microprocessor, an embedded processor, a digital signal processor (DSP), a graphics processor (GPU), a network processor, a field programmable gate array or other device configured to execute code. The processors may be multithreaded cores in that they may include more than one hardware thread context (or "logical processor") per core. Processor 820 may be implemented as a complex instruction set computer (CISC) or a reduced instruction set computer (RISC) processor. In some embodiments, processor 820 may be configured as an x86 instruction set compatible processor.

Memory 830 can be implemented using any suitable type of digital storage including, for example, flash memory and/or random access memory (RAM). In some embodiments, the memory 830 may include various layers of memory hierarchy and/or memory caches as are known to those of skill in the art. Memory 830 may be implemented as a volatile memory device such as, but not limited to, a RAM, dynamic RAM (DRAM), or static RAM (SRAM) device. Storage system 870 may be implemented as a non-volatile storage device such as, but not limited to, one or more of a hard disk drive (HDD), a solid-state drive (SSD), a universal serial bus (USB) drive, an optical disk drive, tape drive, an internal storage device, an attached storage device, flash memory, battery backed-up synchronous DRAM (SDRAM), and/or a network accessible storage device. In some embodiments, storage 870 may comprise technology to increase the storage performance enhanced protection for valuable digital media when multiple hard drives are included.

Processor 820 may be configured to execute an Operating System (OS) 880 which may comprise any suitable operating system, such as Google Android (Google Inc., Mountain View, Calif.), Microsoft Windows (Microsoft Corp., Redmond, Wash.), Apple OS X (Apple Inc., Cupertino, Calif.), Linux, or a real-time operating system (RTOS). As will be appreciated in light of this disclosure, the techniques provided herein can be implemented without regard to the particular operating system provided in conjunction with system 800, and therefore may also be implemented using any suitable existing or subsequently-developed platform.

Network interface circuit 840 can be any appropriate network chip or chipset which allows for wired and/or wireless connection between other components of system 800 and/or network 894, thereby enabling system 800 to communicate with other local and/or remote computing systems, servers, cloud-based servers, and/or other resources. Wired communication may conform to existing (or yet to be developed) standards, such as, for example, Ethernet. Wireless communication may conform to existing (or yet to be developed) standards, such as, for example, cellular communications including LTE (Long Term Evolution), Wireless Fidelity (Wi-Fi), Bluetooth, and/or Near Field Communication (NFC). Exemplary wireless networks include, but are not limited to, wireless local area networks, wireless personal area networks, wireless metropolitan area networks, cellular networks, and satellite networks.

I/O system 850 may be configured to interface between various I/O devices and other components of system 800. I/O devices may include, but not be limited to, user interface 860 and display element 862. User interface 860 may include other devices (not shown) such as a touchpad, keyboard, mouse, microphone and speaker, etc. I/O system 850 may include a graphics subsystem configured to perform processing of images for rendering on the display element. Graphics subsystem may be a graphics processing unit or a visual processing unit (VPU), for example. An analog or digital interface may be used to communicatively couple graphics subsystem and the display element. For example, the interface may be any of a high definition multimedia interface (HDMI), DisplayPort, wireless HDMI, and/or any other suitable interface using wireless high definition compliant techniques. In some embodiments, the graphics subsystem could be integrated into processor 820 or any chipset of platform 810.

It will be appreciated that in some embodiments, the various components of the system 800 may be combined or integrated in a system-on-a-chip (SoC) architecture. In some embodiments, the components may be hardware components, firmware components, software components or any suitable combination of hardware, firmware or software.

PLL circuit 102 is configured to generate an output signal at a desired frequency or phase relative to a reference input signal. This output signal may be employed for various purposes, including but not limited to, a clock signal to drive other circuits, a synchronization signal, and/or a modulation/demodulation signal for a radio transceiver, as previously described. PLL configuration/calibration system 120 is configured to set up or reconfigure the PLL circuit 102 using an efficient lookup table implementation of calibrated configuration parameters. PLL configuration/calibration system 120 is also configured to generate that lookup table, as described previously. PLL circuit 102 and PLL configuration/calibration system 120 may include any or all of the circuits/components illustrated in FIGS. 1-6, as described above. These components can be implemented or otherwise used in conjunction with a variety of suitable software and/or hardware that is coupled to or that otherwise forms a part of platform 810. These components can additionally or alternatively be implemented or otherwise used in conjunction with user I/O devices that are capable of providing information to, and receiving information and commands from, a user.

In some embodiments, these circuits may be installed local to system 800, as shown in the example embodiment of FIG. 8. Alternatively, system 800 can be implemented in a client-server arrangement wherein at least some functionality associated with these circuits is provided to system 800 using an applet, such as a JavaScript applet, or other downloadable module or set of sub-modules. Such remotely accessible modules or sub-modules can be provisioned in real-time, in response to a request from a client computing system for access to a given server having resources that are of interest to the user of the client computing system. In such embodiments, the server can be local to network 894 or remotely coupled to network 894 by one or more other networks and/or communication channels. In some cases, access to resources on a given network or computing system may require credentials such as usernames, passwords, and/or compliance with any other suitable security mechanism.

In various embodiments, system 800 may be implemented as a wireless system, a wired system, or a combination of both. When implemented as a wireless system, system 800 may include components and interfaces suitable for communicating over a wireless shared media, such as one or more antennae, transmitters, receivers, transceivers, amplifiers, filters, control logic, and so forth. An example of wireless shared media may include portions of a wireless spectrum, such as the radio frequency spectrum and so forth. When implemented as a wired system, system 800 may include components and interfaces suitable for communicating over wired communications media, such as input/output adapters, physical connectors to connect the input/output adaptor with a corresponding wired communications medium, a network interface card (NIC), disc controller, video controller, audio controller, and so forth. Examples of wired communications media may include a wire, cable metal leads, printed circuit board (PCB), backplane, switch fabric, semiconductor material, twisted pair wire, coaxial cable, fiber optics, and so forth.

Various embodiments may be implemented using hardware elements, software elements, or a combination of both. Examples of hardware elements may include processors, microprocessors, circuits, circuit elements (for example, transistors, resistors, capacitors, inductors, and so forth), integrated circuits, ASICs, programmable logic devices, digital signal processors, FPGAs, logic gates, registers, semiconductor devices, chips, microchips, chipsets, and so forth. Examples of software may include software components, programs, applications, computer programs, application programs, system programs, machine programs, operating system software, middleware, firmware, software modules, routines, subroutines, functions, methods, procedures, software interfaces, application program interfaces, instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power level, heat tolerances, processing cycle budget, input data rates, output data rates, memory resources, data bus speeds, and other design or performance constraints.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still cooperate or interact with each other.

The various embodiments disclosed herein can be implemented in various forms of hardware, software, firmware, and/or special purpose processors. For example, in one embodiment at least one non-transitory computer readable storage medium has instructions encoded thereon that, when executed by one or more processors, cause one or more of the PLL configuration methodologies disclosed herein to be implemented. The instructions can be encoded using a suitable programming language, such as C, C++, object oriented C, Java, JavaScript, Visual Basic .NET, Beginner's All-Purpose Symbolic Instruction Code (BASIC), or alternatively, using custom or proprietary instruction sets. The instructions can be provided in the form of one or more computer software applications and/or applets that are tangibly embodied on a memory device, and that can be executed by a computer having any suitable architecture. In one embodiment, the system can be hosted on a given website and implemented, for example, using JavaScript or another suitable browser-based technology. For instance, in certain embodiments, the system may leverage processing resources provided by a remote computer system accessible via network 894. In other embodiments, the functionalities disclosed herein can be incorporated into other applications including communications/telecommunications of various types. The computer software applications disclosed herein may include any number of different modules, sub-modules, or other components of distinct functionality, and can provide information to, or receive information from, still other components. These modules can be used, for example, to communicate with input and/or output devices such as a display screen, a touch sensitive surface, a printer, and/or any other suitable device. Other componentry and functionality not reflected in the illustrations will be apparent in light of this disclosure, and it will be appreciated that other embodiments are not limited to any particular hardware or software configuration. Thus, in other embodiments system 800 may comprise additional, fewer, or alternative subcomponents as compared to those included in the example embodiment of FIG. 8.

The aforementioned non-transitory computer readable medium may be any suitable medium for storing digital information, such as a hard drive, a server, a flash memory, and/or random access memory (RAM), or a combination of memories. In alternative embodiments, the components and/or modules disclosed herein can be implemented with hardware, including gate level logic such as a field-programmable gate array (FPGA), or alternatively, a purpose-built semiconductor such as an application-specific integrated circuit (ASIC). In some embodiments, the hardware may be modeled or developed using hardware description languages such as, for example Verilog or VHDL. Still other embodiments may be implemented with a microcontroller having a number of input/output ports for receiving and outputting data, and a number of embedded routines for carrying out the various functionalities disclosed herein. It will be apparent that any suitable combination of hardware, software, and firmware can be used, and that other embodiments are not limited to any particular system architecture.

Some embodiments may be implemented, for example, using a machine readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, process, or the like, and may be implemented using any suitable combination of hardware and/or software. The machine readable medium or article may include, for example, any suitable type of memory unit, memory device, memory article, memory medium, storage device, storage article, storage medium, and/or storage unit, such as memory, removable or non-removable media, erasable or non-erasable media, writeable or rewriteable media, digital or analog media, hard disk, floppy disk, compact disk read only memory (CD-ROM), compact disk recordable (CD-R) memory, compact disk rewriteable (CR-RW) memory, optical disk, magnetic media, magneto-optical media, removable memory cards or disks, various types of digital versatile disk (DVD), a tape, a cassette, or the like. The instructions may include any suitable type of code, such as source code, compiled code, interpreted code, executable code, static code, dynamic code, encrypted code, and the like, implemented using any suitable high level, low level, object oriented, visual, compiled, and/or interpreted programming language.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical quantities within the registers, memory units, or other such information storage transmission or displays of the computer system. The embodiments are not limited in this context.

The terms "circuit" or "circuitry," as used in any embodiment herein, are functional and may comprise, for example, singly or in any combination, hardwired circuitry, programmable circuitry such as computer processors comprising one or more individual instruction processing cores, state machine circuitry, and/or firmware that stores instructions executed by programmable circuitry. The circuitry may include a processor and/or controller configured to execute one or more instructions to perform one or more operations described herein. The instructions may be embodied as, for example, an application, software, firmware, etc. configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads, etc., in a hierarchical fashion. Firmware may be embodied as code, instructions or instruction sets and/or data that are hard-coded (e.g., nonvolatile) in memory devices. The circuitry may, collectively or individually, be embodied as circuitry that forms part of a larger system, for example, an integrated circuit (IC), an application-specific integrated circuit (ASIC), a system-on-a-chip (SoC), desktop computers, laptop computers, tablet computers, servers, smart phones, etc. Other embodiments may be implemented as software executed by a programmable control device. In such cases, the terms "circuit" or "circuitry" are intended to include a combination of software and hardware such as a programmable control device or a processor capable of executing the software. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Numerous specific details have been set forth herein to provide a thorough understanding of the embodiments. It will be understood by an ordinarily-skilled artisan, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

Further Example Embodiments

The following examples pertain to further embodiments, from which numerous permutations and configurations will be apparent.

One example embodiment of the present disclosure provides a method for phase-locked loop (PLL) configuration. The method includes: selecting, by a processor-based system, one of a plurality of voltage controlled oscillators (VCOs) of a PLL; selecting, by the processor-based system, one of a plurality of tuning parameters to control the selected VCO; testing, by the processor-based system, each of a plurality of loop divider values to determine a minimum loop divider value and a maximum loop divider value, the minimum loop divider value and the maximum loop divider value to define endpoints of a range of loop divider values for which the PLL achieves a locked state using the selected VCO and the selected tuning parameter; and storing, by the processor-based system, calibrated PLL configuration parameters to an entry in a configuration storage, the calibrated PLL configuration parameters comprising an identification of the selected VCO, the selected tuning parameter, the minimum loop divider value, and the maximum loop divider value.

In some cases, the method further includes generating additional entries in the configuration storage based on a repetition of the method applied to one or more combinations of each of the plurality of VCOs and each of the plurality of tuning parameters. In some cases, the method further includes searching the configuration storage based on a requested divide value, the search to find one or more candidate configuration storage entries that specify a minimum loop divider value that is less than the requested divide value and a maximum loop divider value that is greater than the requested divide value. In some such cases, the method further includes performing the search as a plurality of parallel searching operations, each of the parallel searching operations applied to a different segment of the configuration storage. In some such cases, the method further includes calculating a mid-point between the maximum loop divider value and the minimum loop divider value of each of the candidate configuration storage entries; and selecting one of the candidate configuration storage entries for configuration of the PLL, the selected candidate entry associated with the minimum distance between the mid-point and the requested divide value. In some such cases, the method further includes applying the parameters of the selected candidate entry to the PLL to configure the PLL. In some such cases, the configuration storage is a lookup table indexed by one or more parameters, wherein the one or more parameters include the requested divide value. In some cases, the calibrated PLL configuration parameters further comprise a pre-determined VCO bias and one or more pre-determined loop filter gains. In some cases, the configuration storage entry is associated with a frequency range of an output signal of the PLL.

Another example embodiment of the present disclosure provides a system for configuring a phase-locked loop (PLL). The system includes: a parameter generation circuit to select one of a plurality of voltage controlled oscillators (VCOs) of a PLL, and to select one of a plurality of tuning parameters to control the selected VCO; a valid lock range detection circuit to generate a PLL lock detection signal in response to the PLL achieving a locked state; the parameter generation circuit further to test each of a plurality of loop divider values to determine a minimum loop divider value and a maximum loop divider value, the minimum loop divider value and the maximum loop divider value to define endpoints of a range of loop divider values for which the PLL lock detection signal is generated based on use of the selected VCO and the selected tuning parameter; and a lookup table (LUT) generation circuit to store calibrated PLL configuration parameters to an entry in a configuration LUT, the calibrated PLL configuration parameters comprising an identification of the selected VCO, the selected tuning parameter, the minimum loop divider value, and the maximum loop divider value.

In some cases, the parameter generation circuit is further to determine additional pairs of minimum loop divider values and maximum loop divider values, each pair associated with one or more combinations of each of the plurality of VCOs and each of the plurality of tuning parameters; and the LUT generation circuit is further to generate additional entries in the configuration LUT based on the additional pairs. In some cases, the system further includes an LUT search circuit to search the configuration LUT based on a requested divide value, the search to find one or more candidate configuration LUT entries that specify a minimum loop divider value that is less than the requested divide value and a maximum loop divider value that is greater than the requested divide value. In some such cases, the LUT search circuit is further to perform the search as a plurality of parallel searching operations, each of the parallel searching operations applied to a different segment of the configuration LUT. In some such cases, the system further includes: a mid-point calculation circuit to calculate a mid-point between the maximum loop divider value and the minimum loop divider value of each of the candidate configuration LUT entries; and a selection circuit to select one of the candidate configuration LUT entries for configuration of the PLL, the selected candidate entry associated with the minimum distance between the mid-point and the requested divide value. In some such cases, the selection circuit is further to apply the parameters of the selected candidate entry to the PLL to configure the PLL. In some cases, the calibrated PLL configuration parameters further comprise a pre-determined VCO bias and one or more pre-determined loop filter gains. In some cases, the configuration LUT entry is associated with a frequency range of an output signal of the PLL.

Another example embodiment of the present disclosure provides at least one non-transitory computer readable storage medium having instructions encoded thereon that, when executed by one or more processors, result in the following operations for phase-locked loop (PLL) configuration. The operations include: selecting one of a plurality of voltage controlled oscillators (VCOs) of a PLL; selecting one of a plurality of tuning parameters to control the selected VCO; testing each of a plurality of loop divider values to determine a minimum loop divider value and a maximum loop divider value, the minimum loop divider value and the maximum loop divider value to define endpoints of a range of loop divider values for which the PLL achieves a locked state using the selected VCO and the selected tuning parameter; and storing calibrated PLL configuration parameters to an entry in a configuration storage, the calibrated PLL configuration parameters comprising an identification of the selected VCO, the selected tuning parameter, the minimum loop divider value, and the maximum loop divider value.

In some cases, the operations further include generating additional entries in the configuration storage based on a repetition of the operations applied to one or more combinations of each of the plurality of VCOs and each of the plurality of tuning parameters. In some cases, the operations further include searching the configuration storage based on a requested divide value, the search to find one or more candidate configuration storage entries that specify a minimum loop divider value that is less than the requested divide value and a maximum loop divider value that is greater than the requested divide value. In some such cases, the operations further include performing the search as a plurality of parallel searching operations, each of the parallel searching operations applied to a different segment of the configuration storage. In some such cases, the operations further include: calculating a mid-point between the maximum loop divider value and the minimum loop divider value of each of the candidate configuration storage entries; and selecting one of the candidate configuration storage entries for configuration of the PLL, the selected candidate entry associated with the minimum distance between the mid-point and the requested divide value. In some such cases, the operations further include applying the parameters of the selected candidate entry to the PLL to configure the PLL. In some such cases, the configuration storage is a lookup table indexed by one or more parameters, wherein the one or more parameters include the requested divide value. In some cases, the calibrated PLL configuration parameters further comprise a pre-determined VCO bias and one or more pre-determined loop filter gains. In some cases, the configuration storage entry is associated with a frequency range of an output signal of the PLL.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. It is intended that the scope of the present disclosure be limited not be this detailed description, but rather by the claims appended hereto. Future filed applications claiming priority to this application may claim the disclosed subject matter in a different manner, and may generally include any set of one or more elements as variously disclosed or otherwise demonstrated herein.

What is claimed is:

1. A processor-implemented method for phase-locked loop (PLL) configuration, the method comprising:
   selecting, by a processor-based system, one of a plurality of voltage controlled oscillators (VCOs) of a PLL;
   selecting, by the processor-based system, one of a plurality of tuning parameters to control the selected VCO;
   testing, by the processor-based system, each of a plurality of loop divider values to determine a minimum loop divider value and a maximum loop divider value, the minimum loop divider value and the maximum loop divider value to define endpoints of a range of loop divider values for which the PLL achieves a locked state using the selected VCO and the selected tuning parameter; and
   storing, by the processor-based system, calibrated PLL configuration parameters to an entry in a configuration storage, the calibrated PLL configuration parameters comprising an identification of the selected VCO, the selected tuning parameter, the minimum loop divider value, and the maximum loop divider value.

2. The method of claim 1, further comprising generating additional entries in the configuration storage based on a repetition of the method applied to one or more combinations of each of the plurality of VCOs and each of the plurality of tuning parameters.

3. The method of claim 1, further comprising searching the configuration storage based on a requested divide value, the search to find one or more candidate configuration storage entries that specify a minimum loop divider value that is less than the requested divide value and a maximum loop divider value that is greater than the requested divide value.

4. The method of claim 3, further comprising performing the search as a plurality of parallel searching operations, each of the parallel searching operations applied to a different segment of the configuration storage.

5. The method of claim 3, further comprising: calculating a mid-point between the maximum loop divider value and the minimum loop divider value of each of the candidate configuration storage entries; and selecting one of the candidate configuration storage entries for configuration of the PLL, the selected candidate entry associated with the minimum distance between the mid-point and the requested divide value.

6. The method of claim 5, further comprising applying the parameters of the selected candidate entry to the PLL to configure the PLL.

7. The method of claim 3, wherein the configuration storage is a lookup table indexed by one or more parameters, wherein the one or more parameters include the requested divide value.

8. The method of claim 1, wherein the calibrated PLL configuration parameters further comprise a pre-determined VCO bias and one or more pre-determined loop filter gains.

9. The method of claim 1, wherein the configuration storage entry is associated with a frequency range of an output signal of the PLL.

10. A system for configuring a phase-locked loop (PLL), the system comprising:
    a parameter generation circuit to select one of a plurality of voltage controlled oscillators (VCOs) of a PLL, and to select one of a plurality of tuning parameters to control the selected VCO;
    a valid lock range detection circuit to generate a PLL lock detection signal in response to the PLL achieving a locked state;
    the parameter generation circuit further to test each of a plurality of loop divider values to determine a minimum loop divider value and a maximum loop divider value, the minimum loop divider value and the maximum loop divider value to define endpoints of a range of loop divider values for which the PLL lock detection signal is generated based on use of the selected VCO and the selected tuning parameter; and
    a lookup table (LUT) generation circuit to store calibrated PLL configuration parameters to an entry in a configuration LUT, the calibrated PLL configuration parameters comprising an identification of the selected VCO, the selected tuning parameter, the minimum loop divider value, and the maximum loop divider value.

11. The system of claim 10, wherein the parameter generation circuit is further to determine additional pairs of minimum loop divider values and maximum loop divider values, each pair associated with one or more combinations of each of the plurality of VCOs and each of the plurality of tuning parameters; and the LUT generation circuit is further to generate additional entries in the configuration LUT based on the additional pairs.

12. The system of claim 10, further comprising an LUT search circuit to search the configuration LUT based on a requested divide value, the search to find one or more candidate configuration LUT entries that specify a minimum loop divider value that is less than the requested divide value and a maximum loop divider value that is greater than the requested divide value.

13. The system of claim 12, wherein the LUT search circuit is further to perform the search as a plurality of parallel searching operations, each of the parallel searching operations applied to a different segment of the configuration LUT.

14. The system of claim 12, further comprising: a mid-point calculation circuit to calculate a mid-point between the maximum loop divider value and the minimum loop divider value of each of the candidate configuration LUT entries; and a selection circuit to select one of the candidate configuration LUT entries for configuration of the PLL, the selected candidate entry associated with the minimum distance between the mid-point and the requested divide value.

15. The system of claim 14, wherein the selection circuit is further to apply the parameters of the selected candidate entry to the PLL to configure the PLL.

16. The system of claim 10, wherein the calibrated PLL configuration parameters further comprise a pre-determined VCO bias and one or more pre-determined loop filter gains.

17. The system of claim 10, wherein the configuration LUT entry is associated with a frequency range of an output signal of the PLL.

18. At least one non-transitory computer readable storage medium having instructions encoded thereon that, when executed by one or more processors, result in the following operations for phase-locked loop (PLL) configuration, the operations comprising:
    selecting one of a plurality of voltage controlled oscillators (VCOs) of a PLL;
    selecting one of a plurality of tuning parameters to control the selected VCO;
    testing each of a plurality of loop divider values to determine a minimum loop divider value and a maximum loop divider value, the minimum loop divider value and the maximum loop divider value to define endpoints of a range of loop divider values for which the PLL achieves a locked state using the selected VCO and the selected tuning parameter; and
    storing calibrated PLL configuration parameters to an entry in a configuration storage, the calibrated PLL configuration parameters comprising an identification of the selected VCO, the selected tuning parameter, the minimum loop divider value, and the maximum loop divider value.

19. The computer readable storage medium of claim 18, further comprising the operation of generating additional entries in the configuration storage based on a repetition of the operations applied to one or more combinations of each of the plurality of VCOs and each of the plurality of tuning parameters.

20. The computer readable storage medium of claim 18, further comprising the operation of searching the configuration storage based on a requested divide value, the search to find one or more candidate configuration storage entries that specify a minimum loop divider value that is less than the requested divide value and a maximum loop divider value that is greater than the requested divide value.

21. The computer readable storage medium of claim 20, further comprising the operation of performing the search as a plurality of parallel searching operations, each of the parallel searching operations applied to a different segment of the configuration storage.

22. The computer readable storage medium of claim 20, further comprising the operations of: calculating a mid-point between the maximum loop divider value and the minimum loop divider value of each of the candidate configuration storage entries; and selecting one of the candidate configuration storage entries for configuration of the PLL, the selected candidate entry associated with the minimum distance between the mid-point and the requested divide value.

23. The computer readable storage medium of claim 22, further comprising the operation of applying the parameters of the selected candidate entry to the PLL to configure the PLL.

24. The computer readable storage medium of claim 20, wherein the configuration storage is a lookup table indexed by one or more parameters, wherein the one or more parameters include the requested divide value.

25. The computer readable storage medium of claim 18, wherein the calibrated PLL configuration parameters further comprise a pre-determined VCO bias and one or more pre-determined loop filter gains.

26. The computer readable storage medium of claim 18, wherein the configuration storage entry is associated with a frequency range of an output signal of the PLL.

* * * * *